US011309300B2

(12) United States Patent
Kim

(10) Patent No.: US 11,309,300 B2
(45) Date of Patent: Apr. 19, 2022

(54) SEMICONDUCTOR PACKAGE INCLUDING PROCESSOR CHIP AND MEMORY CHIP

(71) Applicant: SAMSUNG ELECTRONICS CO., LTD., Suwon-si (KR)

(72) Inventor: Kil-soo Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 664 days.

(21) Appl. No.: 16/051,926

(22) Filed: Aug. 1, 2018

(65) Prior Publication Data

US 2019/0148349 A1 May 16, 2019

(30) Foreign Application Priority Data

Nov. 13, 2017 (KR) .................. 10-2017-0150710

(51) Int. Cl.
*H01L 25/18* (2006.01)
*H01L 25/065* (2006.01)
(Continued)

(52) U.S. Cl.
CPC .......... *H01L 25/18* (2013.01); *H01L 23/3128* (2013.01); *H01L 23/5384* (2013.01);
(Continued)

(58) Field of Classification Search
CPC . H01L 25/18; H01L 23/3128; H01L 23/5384; H01L 23/5385; H01L 24/49; H01L 25/0657; H01L 23/5386; H01L 24/05; H01L 24/16; H01L 24/32; H01L 24/33; H01L 24/48; H01L 24/73; H01L 2224/04042; H01L 2224/16227;
(Continued)

(56) References Cited

U.S. PATENT DOCUMENTS 7,291,916 B2 * 11/2007 Hsu ...................... H05K 1/0216
174/255
7,749,807 B2 7/2010 Karnezos
(Continued)

FOREIGN PATENT DOCUMENTS

KR  10-2011-0124061 A   11/2011
KR      10-1764144 B1    7/2017

*Primary Examiner* — Allen L Parker
*Assistant Examiner* — Charles N Ausar-El
(74) *Attorney, Agent, or Firm* — Lee IP Law, P.C.

(57) ABSTRACT

A semiconductor package includes a package substrate, a processor chip mounted on a first region of the package substrate, a plurality of memory chips mounted on a second region of the package substrate being spaced apart from the first region of the package substrate, a signal transmission device mounted on a third region of the package substrate between the first and second regions of the package substrate, and a plurality of first bonding wires connecting the plurality of memory chips to the signal transmission device. The signal transmission device includes upper pads connected to the plurality of first bonding wires, penetrating electrodes arranged in a main body portion of the signal transmission device and connected to the upper pads, and lower pads in a lower surface portion of the signal transmission device and connected to the penetrating electrodes and connected to the package substrate via bonding balls.

14 Claims, 14 Drawing Sheets

(51) Int. Cl.
*H01L 23/31* (2006.01)
*H01L 23/538* (2006.01)
*H01L 23/00* (2006.01)

(52) U.S. Cl.
CPC ...... *H01L 23/5385* (2013.01); *H01L 23/5386* (2013.01); *H01L 24/49* (2013.01); *H01L 25/0657* (2013.01); *H01L 24/05* (2013.01); *H01L 24/16* (2013.01); *H01L 24/32* (2013.01); *H01L 24/33* (2013.01); *H01L 24/48* (2013.01); *H01L 24/73* (2013.01); *H01L 24/85* (2013.01); *H01L 2224/0401* (2013.01); *H01L 2224/04042* (2013.01); *H01L 2224/0557* (2013.01); *H01L 2224/06181* (2013.01); *H01L 2224/16227* (2013.01); *H01L 2224/32145* (2013.01); *H01L 2224/32225* (2013.01); *H01L 2224/33181* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48106* (2013.01); *H01L 2224/48137* (2013.01); *H01L 2224/48145* (2013.01); *H01L 2224/48157* (2013.01); *H01L 2224/48165* (2013.01); *H01L 2224/48227* (2013.01); *H01L 2224/48464* (2013.01); *H01L 2224/49109* (2013.01); *H01L 2224/73215* (2013.01); *H01L 2224/73257* (2013.01); *H01L 2224/73265* (2013.01); *H01L 2224/85203* (2013.01); *H01L 2224/85205* (2013.01); *H01L 2224/85207* (2013.01); *H01L 2225/0651* (2013.01); *H01L 2225/06506* (2013.01); *H01L 2225/06562* (2013.01); *H01L 2225/06565* (2013.01); *H01L 2225/06586* (2013.01); *H01L 2924/1434* (2013.01); *H01L 2924/15192* (2013.01); *H01L 2924/15311* (2013.01)

(58) Field of Classification Search
CPC . H01L 2224/32145; H01L 2224/32225; H01L 2224/33181; H01L 2224/48091; H01L 2224/48106; H01L 2224/48145; H01L 2224/48157; H01L 2224/48165; H01L 2224/48464; H01L 2224/73215; H01L 2224/73265; H01L 2225/06506; H01L 2225/0651; H01L 2225/06562; H01L 2225/06565; H01L 2225/06586; H01L 2924/1434

See application file for complete search history.

(56) References Cited

U.S. PATENT DOCUMENTS

| | | | |
|---|---|---|---|
| 8,816,487 B2 | 8/2014 | Bae et al. | |
| 8,836,148 B2* | 9/2014 | Gillingham | H01L 23/52 257/666 |
| 8,890,330 B2* | 11/2014 | Kim | H01L 25/18 257/777 |
| 9,275,947 B2* | 3/2016 | Ozawa | H01L 23/50 |
| 9,431,371 B2 | 8/2016 | Karikalan et al. | |
| 9,437,586 B2 | 9/2016 | Hong | |
| 9,589,930 B2* | 3/2017 | Park | H01L 24/32 |
| 9,640,513 B2* | 5/2017 | Lee | H01L 25/0652 |
| 9,847,319 B2* | 12/2017 | Song | H01L 25/105 |
| 10,497,670 B2* | 12/2019 | Na | G11C 29/025 |
| 2006/0108677 A1 | 5/2006 | Ikeda et al. | |
| 2012/0056178 A1* | 3/2012 | Han | H01L 22/32 257/48 |
| 2012/0326304 A1 | 12/2012 | Warren et al. | |
| 2013/0056882 A1* | 3/2013 | Kim | H01L 23/16 257/777 |
| 2014/0002994 A1* | 1/2014 | Walczyk | G01R 31/2874 361/710 |
| 2014/0089609 A1 | 3/2014 | Kegel et al. | |
| 2014/0134804 A1 | 5/2014 | Kelly et al. | |
| 2015/0221614 A1 | 8/2015 | Sutardja | |
| 2019/0050040 A1* | 2/2019 | Baskaran | G06F 1/206 |
| 2019/0088607 A1* | 3/2019 | Wang | H01L 25/18 |
| 2019/0385997 A1* | 12/2019 | Choi | H01F 27/2804 |

* cited by examiner

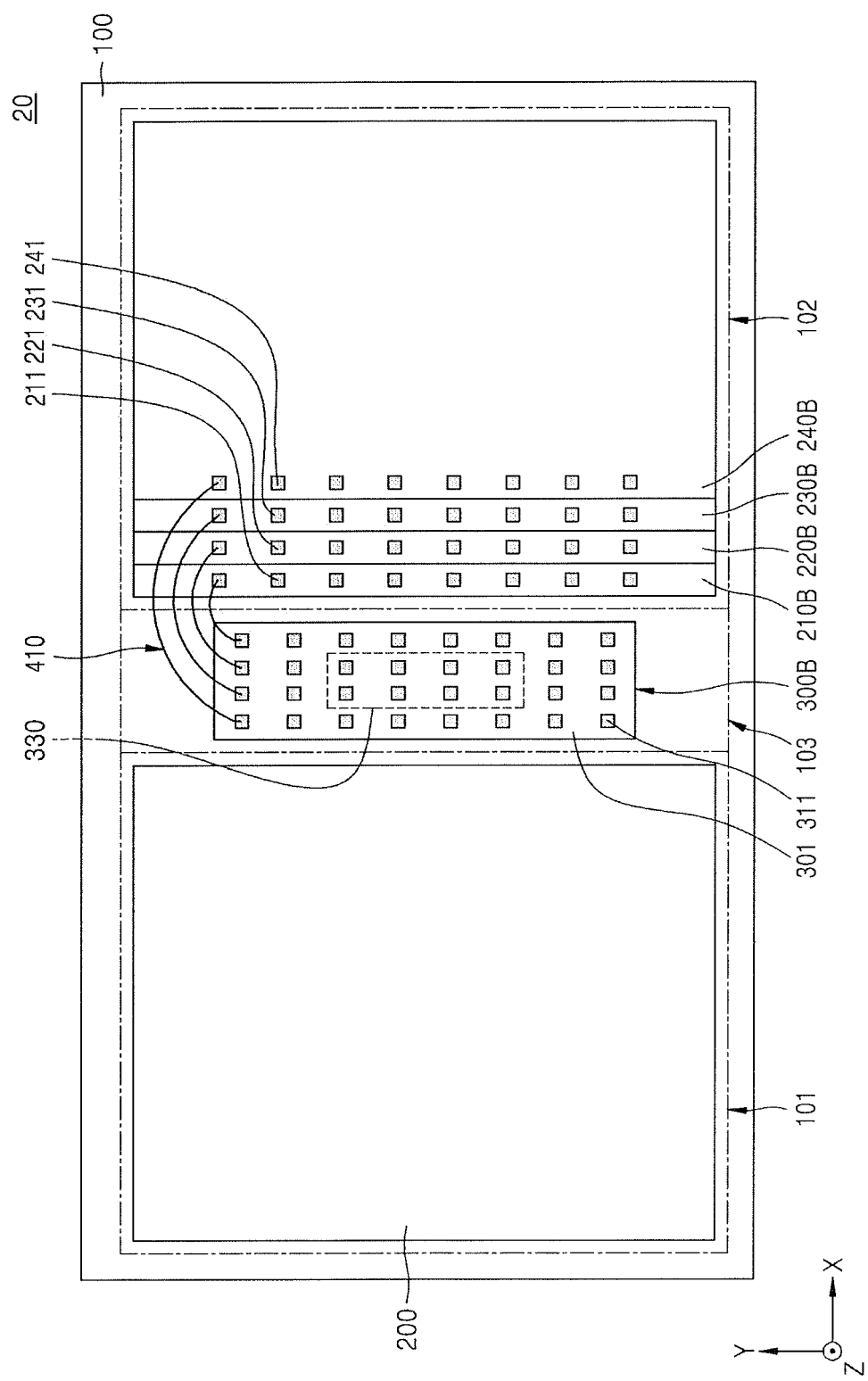

SEMICONDUCTOR PACKAGE INCLUDING PROCESSOR CHIP AND MEMORY CHIP

CROSS-REFERENCE TO RELATED APPLICATION

Korean Patent Application No. 10-2017-0150710, filed on Nov. 13, 2017, in the Korean Intellectual Property Office, and entitled: "Semiconductor Package," is incorporated by reference herein in its entirety.

BACKGROUND

1. Field

Embodiments relate to semiconductor packages, and more particularly, to a system in package (SiP) including a processor chip and a memory chip.

2. Description of the Related Art

Recently, the market demand for mobile or portable devices has increased rapidly, and accordingly, miniaturization and weight reductions of electronic components mounted on such devices have been continuously required. For this purpose, many researches have been conducted to develop a semiconductor package that has a small volume and is able to process high-capacity data by highly integrating and incorporating many semiconductor chips into the semiconductor package. Thus, a system in package (SiP) has been developed to efficiently arrange semiconductor chips, e.g., a processor chip and a memory chip, within a limited space of a semiconductor package.

SUMMARY

Embodiments are directed a semiconductor package, including a package substrate, a processor chip mounted on a first region of the package substrate, a plurality of memory chips mounted on a second region of the package substrate, the second region of the package substrate being spaced apart from the first region of the package substrate, a signal transmission device mounted on a third region of the package substrate between the first and second regions of the package substrate, a plurality of first bonding wires connecting the plurality of memory chips to the signal transmission device. The signal transmission device includes upper pads in an upper surface portion of the signal transmission device and connected to the plurality of first bonding wires, penetrating electrodes in a main body portion of the signal transmission device and connected to the upper pads, and lower pads in a lower surface portion of the signal transmission device. The lower pads are connected to the penetrating electrodes, and connected to the package substrate via bonding balls.

Embodiments are directed to a semiconductor package, including a package substrate including a plurality of internal traces, a processor chip mounted on a first region of the package substrate, a plurality of memory chips mounted on a second region of the package substrate and stacked with adhesion members therebetween, the second region of the package substrate being spaced apart from the first region of the package substrate, the second region of the package substrate, a signal transmission device mounted on a third region of the package substrate between the first and second regions of the package substrate, and a plurality of first bonding wires connecting the plurality of memory chips to the signal transmission device. The processor chip and the signal transmission device transmit a signal via the plurality of internal traces, and the plurality of memory chips and the signal transmission device transmits a signal via the plurality of first bonding wires.

Embodiments are directed to a semiconductor package, including a package substrate, a processor chip mounted on the package substrate, a plurality of memory chips mounted on the package substrate and to exchange data with each other, a signal transmission device mounted on the package substrate, a plurality of first bonding wires connecting the plurality of memory chips to the signal transmission device, and a molding member covering lateral surfaces of the processor chip, the plurality of memory chips, and the signal transmission device. The processor chip, the plurality of memory chips, and the signal transmission device are spaced apart from each other. The signal transmission device includes upper pads in an upper surface portion of the signal transmission device, the upper pads connected to the plurality of first bonding wires, penetrating electrodes in a main body portion of the signal transmission device and connected to the upper pads, and lower pads in a lower surface portion of the signal transmission device. The lower pads are connected to the penetrating electrodes and connected to the package substrate via bonding balls.

BRIEF DESCRIPTION OF THE DRAWINGS

Features will become apparent to those of skill in the art by describing in detail exemplary embodiments with reference to the attached drawings in which:

FIGS. 2A and 2B illustrate a semiconductor package according to an embodiment;

DETAILED DESCRIPTION

Unless mentioned otherwise, a plane area refers to an area of a surface parallel to a main surface of a package substrate, and a thickness refers to a thickness in a vertical direction with respect to the main surface of the package substrate. In addition, unless mentioned otherwise, a vertical direction or a horizontal direction refers to a vertical direction or a horizontal direction with respect to the main surface of the package substrate. Moreover, unless mentioned otherwise, an upper surface of a stack of components on the package substrate refers to a surface opposite to the main surface of the package substrate, and a lower surface of the stack of the components on the package substrate refers to a surface facing the main surface of the package substrate.

Embodiments will now be described more fully hereafter with reference to the accompanying drawings.

FIGS. 1A-1D illustrate a semiconductor package 10 according to an embodiment.

Figure 1A:
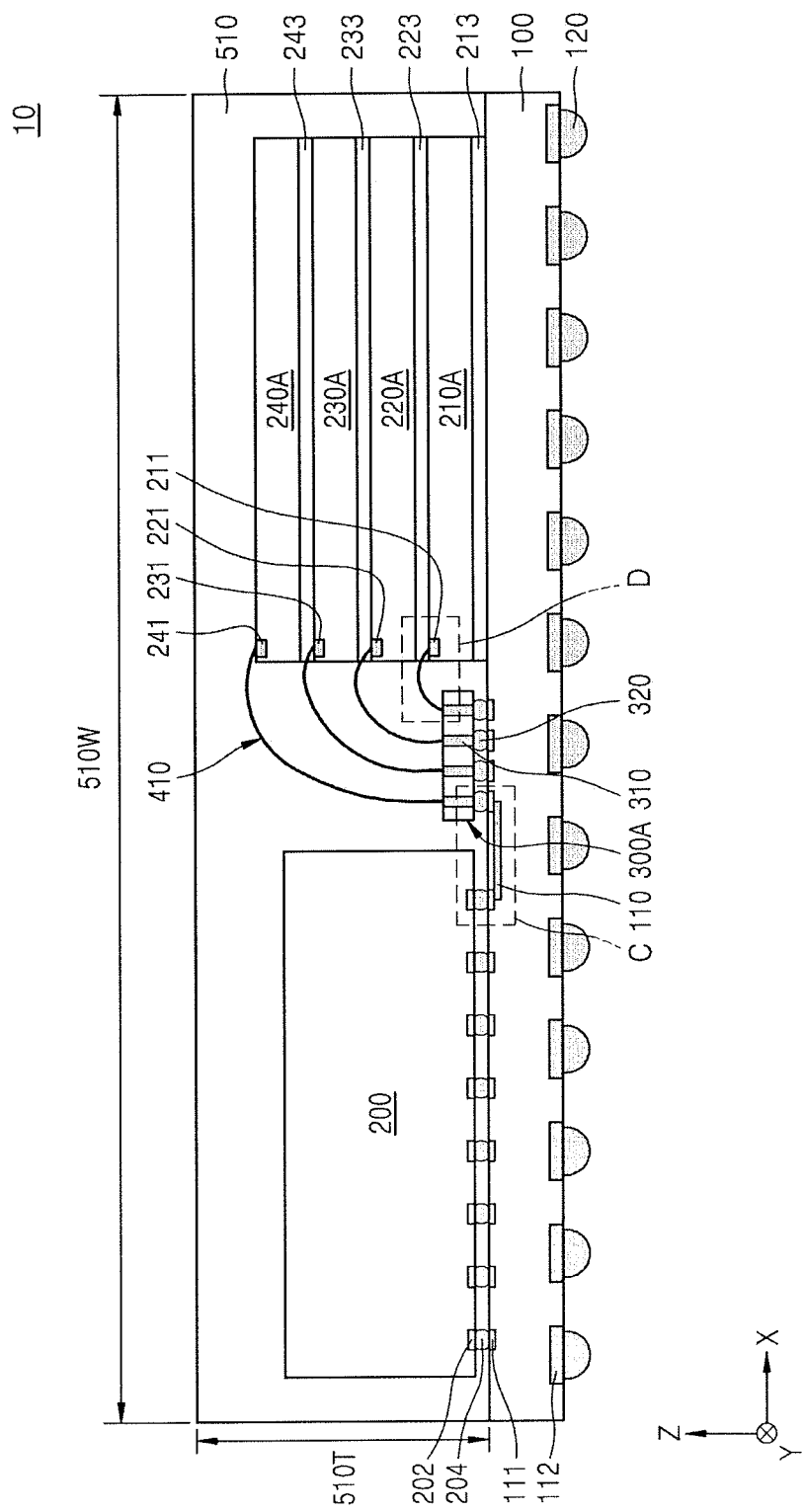
FIGS. 1A-1D illustrate a semiconductor package according to an embodiment.
Figure 1B:
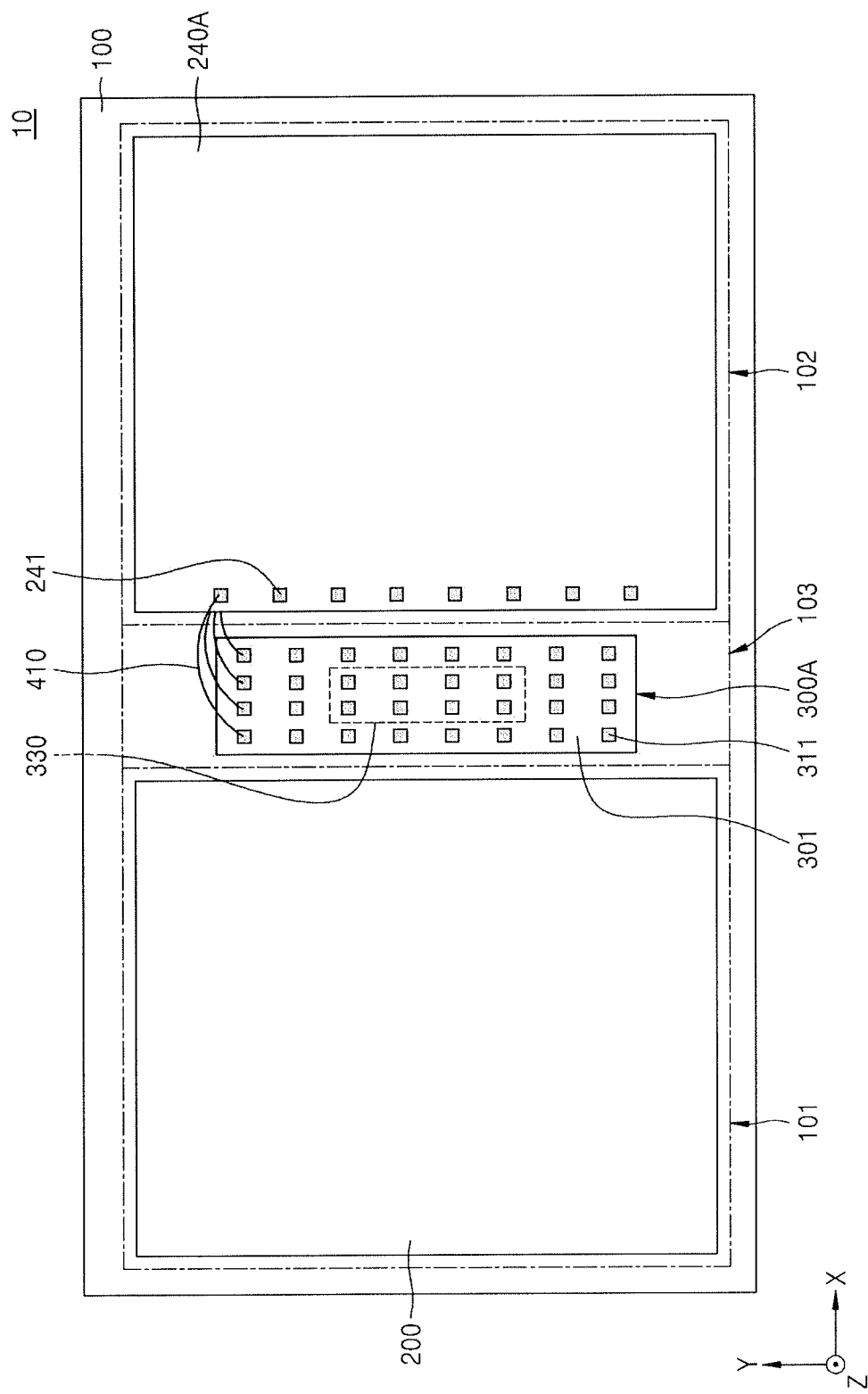

FIG. 1A illustrates a vertical sectional view of the semiconductor package 10, and FIG. 1B illustrates a plan view of the semiconductor package 10. In FIG. 1B, a molding member 510 is not shown for clearly showing an internal structure of the semiconductor package 20.

Referring to FIGS. 1A and 1B, the semiconductor package 10 may include a package substrate 100, an external connection terminal 120, a processor chip 200, a plurality of memory chips 210A, 220A, 230A, and 240A, a signal transmission device 300A, a plurality of first bonding wires 410, and the molding member 510. The package substrate 100 may have a lower surface and an upper surface including a first region 101, a second region 102, and a third region 103 between the first and second regions 101 and 102. The external connection terminal 120 may be formed on the lower surface of the package substrate 100. The processor chip 200 may be mounted on the first region 101 of the upper surface of the package substrate 100. The plurality of memory chips 210A, 220A, 230A, and 240A may be mounted on the second region 102 of the upper surface of the package substrate 100, e.g., in a stack. The signal transmission device 300A may be mounted on the third region 103 of the upper surface of the package substrate 100, e.g., by bonding balls 320, and may be dispositioned between the processor chip 200 and at least one of the plurality of memory chips 210A, 220A, 203A, and 240A in a horizontal direction. The plurality of first bonding wires 410 may connect the plurality of memory chips 210A, 220A, 230A, and 240A to the signal transmission device 300A, and may have difference lengths or the same length.

The package substrate 100 may have upper substrate pads 111 on the upper surface thereof, and may have lower substrate pads 112 on the lower surface thereof. The package substrate 100 may also have an internal trace 110 and a substrate connection via (not shown) that electrically connects the upper substrate pads 111 with the lower substrate pads 112. The package substrate 100 may be, e.g., a printed circuit board (PCB).

The package substrate 100 may be formed of at least one material of phenol resin, epoxy resin, and polyimide. For example, the package substrate 100 may include at least one material of flame retardant 4 (FR4), tetrafunctional epoxy, polyphenylene ether, epoxy/polyphenylene oxide, bismaleimide triazine (BT), thermount, cyanate ester, polyimide, and liquid crystal polymer. The upper substrate pads 111, the lower substrate pads 112, the internal trace 110, and the substrate connection via may be formed at least one of, for example, copper (Cu), nickel (Ni), aluminum (Al), or beryllium copper (BeCu).

The processor chip 200 may be implemented using, e.g., a microprocessor, a graphics processor, a signal processor, a network processor, a chip set, an audio codec, a video codec, an application processor, or a System on Chip (SoC). The microprocessor may include, for example, a single core or multiple cores.

The plurality of memory chips 210A, 220A, 230A, and 240A may include, e.g., a high bandwidth memory. According to some embodiments, the plurality of memory chips 210A, 220A, 230A, and 240A may include, e.g., a volatile and/or nonvolatile memory. The volatile memory may include, for example, a dynamic random access memory (DRAM), a static RAM (SRAM), a thyristor RAM (TRAM), a zero capacitor RAM (ZRAM), or a twin transistor RAM (TTRAM), and memory circuits that are able to temporally store data while powered on. The nonvolatile memory may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, polymer RAM, a nano floating gate memory, a holographic memory, a molecular electronics memory, or an insulator resistance change memory, and memory circuits that are able to maintain data while powered on and off.

Respective one of the plurality of memory chips 210A, 220A, 230A, and 240A may include a semiconductor substrate having an active surface (e.g., an upper surface) and an inactive surface (e.g., a lower surface) facing each other, memory devices on the active surfaces, and a plurality of upper memory bonding pads 211, 221, 231, and 241 on the active surfaces. The plurality of upper memory bonding pads 211, 221, 231, and 241 may be connected to first bonding wires 410, respectively.

In some embodiments, the plurality of memory chips 210A, 220A, 230A, and 240A may be integrated into a single package in a System in Package (SiP), and the number of the plurality of memory chips 210A, 220A, 230A, and 240A may vary according to a purpose of the semiconductor package 10. Embodiments are not restricted by the number of the plurality of memory chips 210A, 220A, 230A, and 240A. For example, more or less memory chips than the plurality of memory chips 210A, 220A, 230A, and 240A may be stacked, e.g., in a vertical direction.

The plurality of memory chips 210A 220A, 230A, and 240A may be stacked on the package substrate 100, and may adhere to each other via, e.g., a plurality of adhesion members 213, 223, 233, and 243.

The plurality of adhesion members 213, 223, 233, and 243 may be, e.g., die attach films (DAFs). The DAFs may include, e.g., inorganic adhesives and polymer adhesives. The polymer adhesives may include a thermosetting resin and a thermoplastic resin. The thermosetting resin may have a three-dimensional (3D) cross-link structure after being heated and molded, and may not soften after being heated again. In contrast, the thermoplastic resin may have plasticity via heating, and may have a linear polymer structure. In some embodiments, the plurality of adhesion members 213, 223, 233, and 243 may be hybrid polymer adhesives obtained by mixing the thermosetting resin and the thermoplastic resin.

The signal transmission device 300A may include a base substrate 301, and a conductive structure formed on the base substrate 301. The base substrate 301 may be a silicon wafer including silicon (Si)(e.g., polycrystal Si, or amorphous Si). The conductive structure of the signal transmission device 300A may include upper pads 311 in an upper surface portion of the base substrate 301, penetrating electrodes 310 in a main body portion of the base substrate 301, and lower pads 312 of FIG. 1C in a lower surface portion of the base substrate 301. The upper pads 311 may be connected to the first bonding wires 410. The penetrating electrodes 310 may be connected to the upper pads 311 and may penetrate the main body portion of the base substrate 301, e.g., in the vertical direction. The lower pads 312 of FIG. 1C may be connected to the penetrating electrodes 310, and may be connected to the package substrate 100 via the bonding balls 320.

The signal transmission device 300A may be mounted on the third region 103 of the upper surface of the package substrate 100 between the first region 101 and the second region 102 of the upper surface of the package substrate 100. In other words, the signal transmission device 300A may be arranged between the processor chip 200 in the first region 101 and the plurality of memory chips 210A, 220A, 230A, and 240A in the second region 102, and may be spaced apart from the processor chip 200 and the plurality of memory chips 210A, 220A, 230A, and 240A, i.e., in a horizontal direction.

According to some embodiments, the signal transmission device 300A may further include a circuit region 330 and a buffer circuit in the circuit region 330. The buffer circuit may control a capacitance loading of the plurality of memory chips 210A, 220A, 230A, and 240A. According to other embodiments, a semiconductor integrated circuit including at least one of a transistor, a diode, a capacitor, and a resistor may be formed in the circuit region 330. The circuit region 330 may overlap with the upper pads 311. In some cases, the circuit region 330 may be omitted.

In a plan view, a plane area of the signal transmission device 300A may be smaller than that of the processor chip 200 and that of each of the plurality of memory chips 210A, 220A, 230A, and 240A.

The plurality of first bonding wires 410 may electrically connect the plurality of memory chips 210A, 220A, 230A, and 240A to the signal transmission device 300A. The plurality of first bonding wires 410 may connect the plurality of upper memory bonding pads 211, 221, 231, and 241 of the plurality of memory chips 210A, 220A, 230A, and 240A to the upper pads 311 of the signal transmission device 300A, respectively. For convenience of explanation, the accompanying drawings illustrate some of the plurality of first bonding wires 410.

The first bonding wires 410 may include at least one of gold (Au), silver (Ag), copper (Cu), or aluminum (Al). According to some embodiments, the first bonding wires 410 may be connected to the plurality of upper memory bonding pads of the plurality of memory chips 210A, 220A, 230A, and 240A or the upper pads 311 of the signal transmission device 300A by at least one of, e.g., thermo-compression bonding and a ultrasonic bonding, and a thermo-sonic bonding performed by mixing the thermo-compression bonding and the ultrasonic bonding.

The molding member 510 may seal or encapsulate the processor chip 200, the plurality of memory chips 210A, 220A, 230A, and 240A, the signal transmission device 300A, and the first bonding wires 410 with the upper surface of the package substrate 100 to thereby protect them from an external environment, e.g., moisture, an impact, a temperature, or static electricity.

The molding member 510 may be formed by injecting an appropriate amount (or a predetermined amount) of molding resin onto the package substrate 100 in an injection process and hardening the injected molding resin in a hardening process, thereby forming an outward appearance of the semiconductor package 10. In a pressurization process. e.g., a pressing process, the outward appearance of the semiconductor package 10 may be formed by applying a pressure to the molding resin. Process conditions, e.g., a delay time between the injection process and the pressurization process on the molding resin, the amount of injected molding resin, a pressing pressure, and a pressing temperature, may be set in consideration of properties, e.g., a viscosity. According to some embodiments, the molding resin may include, e.g., epoxy-group molding resin or polyimide-group molding resin.

The molding member 510 may protect the processor chip 200 and the plurality of memory chips 210A, 220A, 230A, and 240A from an external influence, e.g., moisture, an impact, a temperature, or static electricity. For this protection, the molding member 510 may have a thickness 510T for surrounding a lateral surface of at least the processor chip 200 and respective lateral surfaces of the plurality of memory chips 210A, 220A, 230A, and 240A. For example, the thickness 510T of the molding member 510 may be greater than a thickness of the processor chip 200 or a total thickness of the plurality of memory chips 210A, 220A, 230A, and 240A. According to some embodiments, the molding member 510 may surround or cover an upper surface of the processor chip 200 and/or upper surfaces of the plurality of memory chips 210A, 220A, 230A, and 240A. According to other embodiments, the molding member 510 may expose the upper surface of the processor chip 200 and/or the upper surfaces of the plurality of memory chips 210A, 220A, 230A, and 240A.

In some embodiments, the molding member 510 may entirely/partially cover the package substrate 100, and may have a width 510W that may be substantially the same as a width of the package substrate 100 or the semiconductor package 10 in, e.g., the horizontal direction.

The plurality of memory chips 210A, 220A, 230A, and 240A may be stacked to overlap each other, and may have side walls aligned with each other vertically. At least one of the plurality of first bonding wires 410 may penetrate through e.g., a side wall of at least one of the adhesion members 223, 233, and 243. In this case, compared with semiconductor packages in which a plurality of memory chips are horizontally shifted by a certain distance from each other and vertically stacked, a plane area of the semiconductor package 10 may be relatively small, and accordingly, the width 510W of the molding member 510 may decrease.

In general, a processor chip and a plurality of memory chips may be arranged adjacent to each other in a semiconductor package, and may transmit a signal to each other via an internal trace of a package substrate of the semiconductor package. In this case, a signal transmission between the plurality of memory chips and the internal trace of the package substrate may be performed through a through-silicon via (TSV), not through wire bonding. Use of the TSV for the signal transmission may increase a manufacturing cost of a semiconductor package and complicate a manufacturing process thereof, compared to use of the wire bonding for the signal transmission.

On the contrary, in the semiconductor package 10 according to an embodiment, signals of the plurality of memory chips 210A, 220A, 230A, and 240A may be transmitted to the signal transmission device 300A via the plurality of first bonding wires 410 without passing through the package substrate 100 or without using any trace/wire of the package substrate 100, and a signal of the processor chip 200 may be transmitted to the signal transmission device 300A via the internal trace 110 of the package substrate 100 and then via the bonding balls 320.

In other words, signal transmission paths between the processor chip 200 and the plurality of memory chips 210A, 220A, 230A, and 240A may be formed with, e.g., the plurality of first bonding wires 410, the signal transmission device 300, and the internal trace 110 of the package substrate 100. As a result, the signal transmission paths between the processor chip 200 and the plurality of memory chips 210A, 220A, 230A, and 240A may be efficiently arranged in the semiconductor package 10 to reduce a size of the semiconductor package 10, compared to when the signal transmission paths between the processor chip 200 and the plurality of memory chips 210A, 220A, 230A, and 240A may be formed with only the internal trace of the package substrate 100 or only the plurality of first bonding wires 410. Further, the plurality of first bonding wires 410 and the internal trace 110 of the package substrate 100 may not be adjacent to each other in the horizontal direction, and thus the influence between the signal transmission paths between the processor chip 200 and the plurality of memory chips 210A, 220A, 230A, and 240A, e.g., crosstalk, may be reduced. Moreover, the signal transmission paths between the processor chip 200 and the plurality of memory chips 210A, 220A, 230A, and 240A may be distributed in different routes, e.g., the plurality of first bonding wires 410 and the internal trace 110 of the package substrate 100, for efficient distribution of electrical resistances/impedances for signal transmission, for efficient distribution of electrical resistances/impedances for signal transmission and thus the semiconductor package 10 may have improved performance.

Signal transmission between the processor chip 200 and the signal transmission device 300A and signal transmission between the plurality of memory chips 210A, 220A, 230A, and 240A and the signal transmission device 300A will be described below.

Figure 1C:
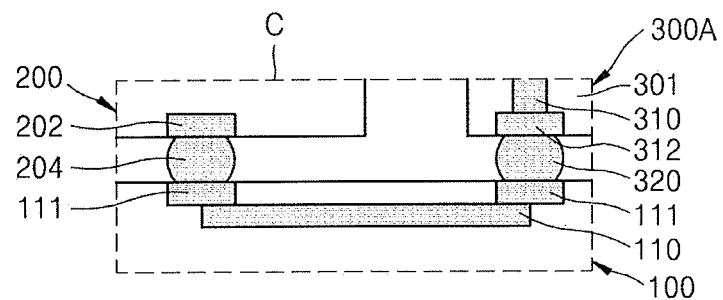

FIG. 1C illustrates a magnified view of a portion C of FIG. 1A.

The processor chip 200 may include chip pads 202 on it lower surface. The chip pads 202 may be connected to a semiconductor device of the processor chip 200 via a wiring structure (not shown). The signal transmission device 300A may include the lower pads 312 on its lower surface. The lower pads 312 may be electrically connected to the upper pads 311 in FIG. 1D via the penetrating electrodes 310 formed in the main body portion of the base substrate 301. The chip pads 202 and the lower pads 312 may be used as terminals for the signal transmission between the processor chip 200 and the signal transmission device 300A. The numbers of the chip pads 202 and the lower pads 312 and arrangements thereof are illustrated as an example, and may be appropriately selected or determined according to the type and capacity of the semiconductor package 10.

The internal trace 110 of the package substrate 100 may electrically connect the processor chip 200 to the signal transmission device 300A. For example, the chip pads 202 may be electrically connected to the internal trace 110 via bonding balls 204 and the upper substrate pads 111, and the lower pads 312 may be electrically connected to the internal trace 110 via the bonding balls 320 and the upper substrate pads 111. In other words, the processor chip 200 and the signal transmission device 300A may transmit (e.g., send and receive) a signal via the internal trace 110 of the package substrate 100.

Figure 1D:
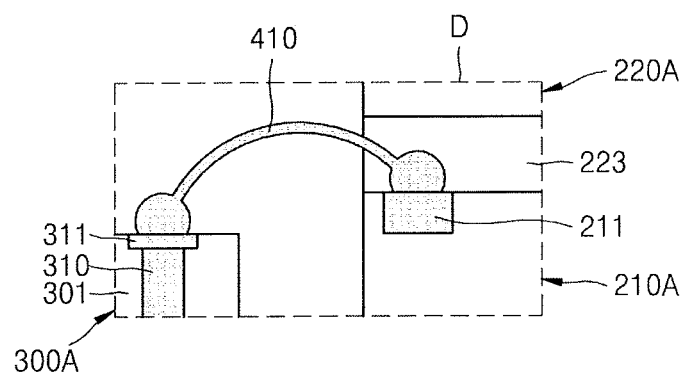

FIG. 1D illustrates a magnified view of a portion D of FIG. 1A.

The memory chip 210A may include the upper memory bonding pad 211 on it upper surface. The upper memory bonding pad 211 may be connected to a semiconductor device of the memory chip 210A via a wiring structure (not shown). The signal transmission device 300A may include the upper pads 311 on its upper surface. The upper pads 311 may be electrically connected to the lower pads 312 in FIG. 1C via the penetrating electrodes 310. The upper memory bonding pads 211 and the upper pads 311 may be used as terminals for the signal transmission between the plurality of memory chips 210A, 220A, 230A, and 240A and the signal transmission device 300A. The numbers of the upper memory bonding pads 211 and upper pads 311 and arrangements thereof are illustrated as an example, and may be appropriately selected or determined according to the type and capacity of the semiconductor package 10.

The first bonding wires 410 may electrically connect the memory chip 210A to the signal transmission device 300A. For example, the first bonding wires 410 may electrically connect the upper memory bonding pads 211 to the upper pads 311. In other words, the memory chip 210A and the signal transmission device 300A may transmit a signal via the first bonding wires 410.

Referring to FIGS. 1A-1D, in the semiconductor package 10 according to an embodiment, the signal transmission between the processor chip 200 and the signal transmission device 300A may be performed via the internal trace 110 of the package substrate 100, and the signal transmission between the plurality of memory chips 210A, 220A, 230A, and 240A and the signal transmission device 300A may be performed via the first bonding wires 410. Thus, in the semiconductor package 10, the processor chip 200 and the plurality of memory chips 210A, 220A, 230A, and 240A may transmit a signal to each other via the signal transmission device 300A.

Figure 2A:
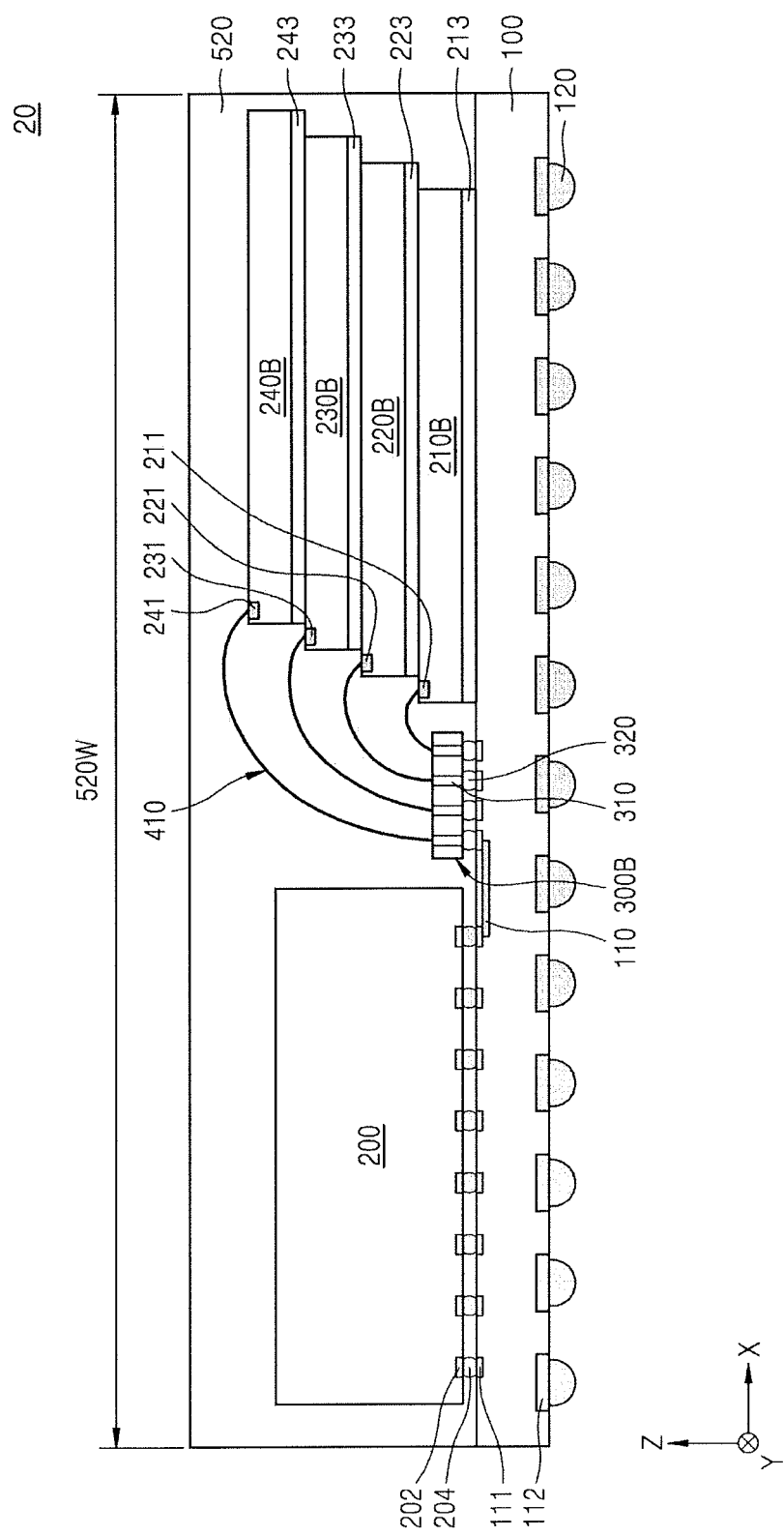

FIGS. 2A and 2B illustrate a semiconductor package 20 according to an embodiment.

FIG. 2A illustrates a vertical sectional view of the semiconductor package 20, and FIG. 2B illustrates a plan view of the semiconductor package 20. In FIG. 2B, a molding member 520 is not shown for clearly showing an internal structure of the semiconductor package 20.

Referring to FIGS. 2A and 2B, the semiconductor package 20 includes the package substrate 100, the processor chip 200, a plurality of memory chips 210B, 220B, 230B, and 240B, a signal transmission device 300B, the plurality of first bonding wires 410, and the molding member 520.

Components that constitute the semiconductor package 20 and materials used to form the components are the same as or similar to those described above with reference to FIGS. 1A and 1B, and thus differences therebetween will be described.

The plurality of memory chips 210B, 220B, 230B, and 240B may be sequentially stacked on the second region 102 of the package substrate 100 in a vertical direction (i.e., in a z direction). The plurality of memory chips 210B. 220B, 230B, and 240B are shifted by a certain distance from each memory chip in a horizontal direction (i.e., in an x direction) on the package substrate 100 such that the upper memory bonding pads 211, 221, and 231 formed in respective portions of the upper surfaces of the plurality of memory chips 210B, 220B, 230B, and 240B do not overlap each other in the vertical direction and are not covered by the adhesion member 223, 233, and 243. As the plurality of memory chips 210B, 220B, 230B, and 240B are positioned farther from the package substrate 100 in the vertical direction, the plurality of memory chips 210B, 220B, 230B, and 240B may be dispositioned farther from the processor chip 200 in the horizontal direction.

As a result, the plurality of first bonding wires 410 may be connected to the upper memory bonding pads 211, 221, 231, and 241 without penetrating through the adhesion member 223, 233, and 243. Thus, the plurality of first bonding wires 410 may electrically connect the upper memory bonding pads 211, 221, 231, and 241 to the signal transmission device 300B without penetrating through the adhesion member 223, 233, and 243. This may bring a difference in a manufacturing process. For example, after all of the plurality of memory chips 210B, 220B, 230B, and 240B are sequentially stacked, the plurality of first bonding wires 410 may be formed in batches.

Compared with semiconductor packages including a plurality of memory chips that are arranged and stacked vertically, a plane area of the semiconductor package 20 may increase, and accordingly, a width 520W of the molding member 520 may increase.

Figure 3A:
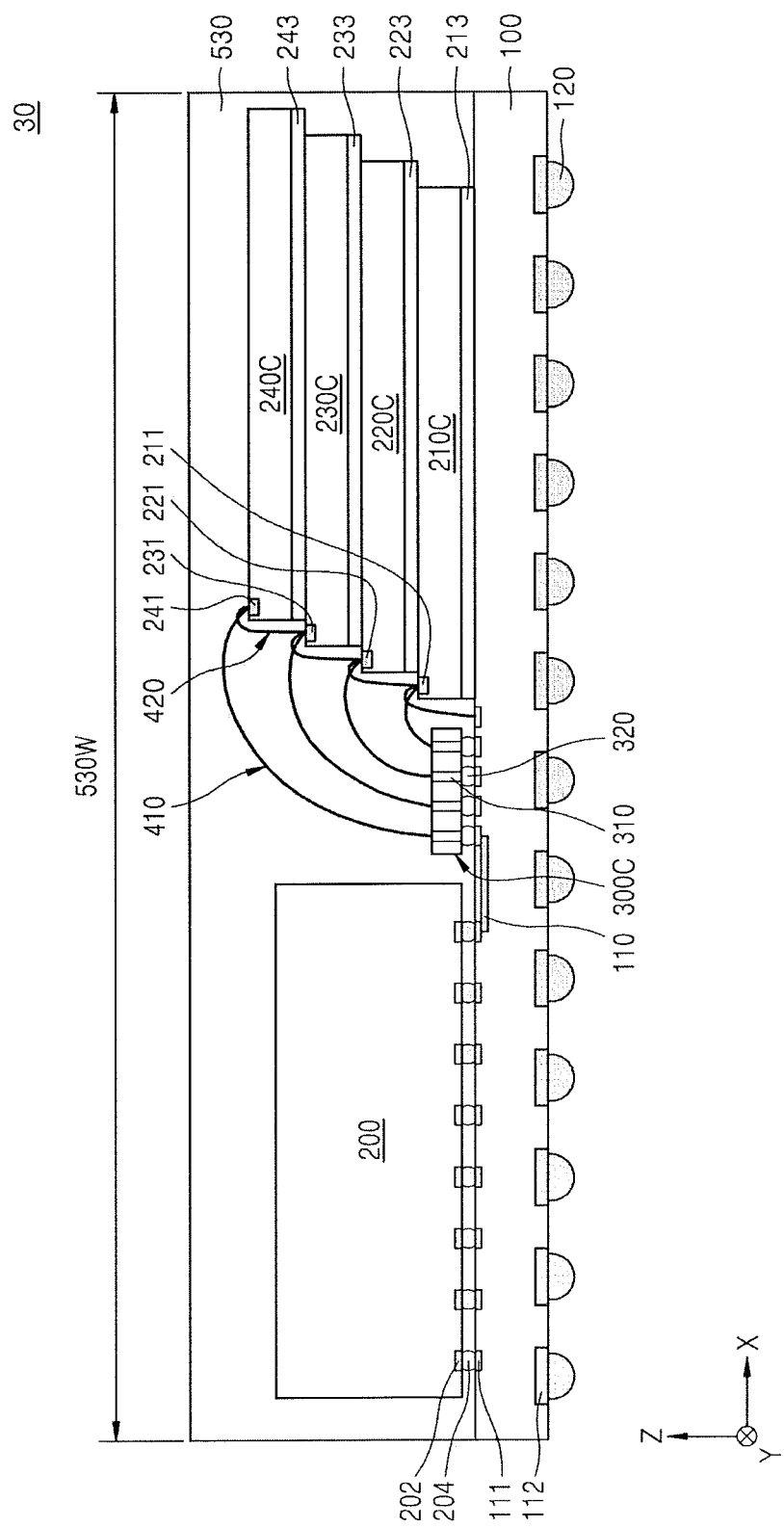
FIGS. 3A and 3B illustrate a semiconductor package according to an embodiment.
Figure 3B:
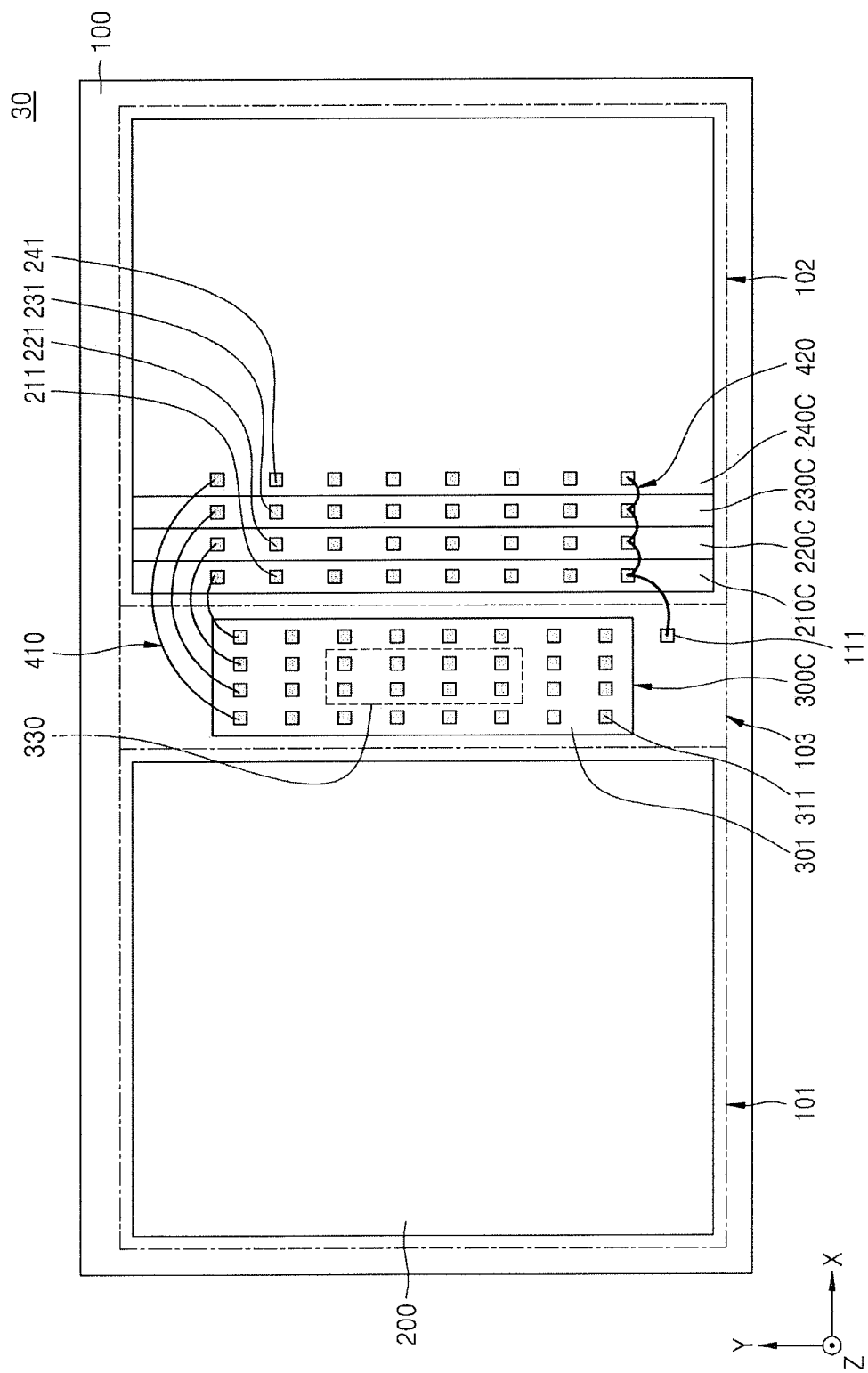

FIGS. 3A and 3B illustrate a semiconductor package 30 according to an embodiment.

FIG. 3A illustrates a vertical sectional view of the semiconductor package 30, and FIG. 3B illustrates a plan view of the semiconductor package 30. In FIG. 3B, a molding member 530 is not shown for clearly showing an internal structure.

Referring to FIGS. 3A and 3B, the semiconductor package 30 includes the package substrate 100, the processor chip 200, a plurality of memory chips 210C, 220C, 230C, and 240C, a signal transmission device 300C, the plurality of first bonding wires 410, a second bonding wire 420, and the molding member 530.

Components that constitute the semiconductor package 30 and materials used to form the components are the same as or similar to those described above with reference to FIGS. 1A and 1B, and thus differences therebetween will be described.

The plurality of memory chips 210C, 220C, 230C, and 240C may be sequentially stacked on the second region 102 of the package substrate 100 in a vertical direction (i.e., in a z direction). The plurality of memory chips 210C, 220C, 230C, and 240C are shifted by a certain distance from each memory chip in a horizontal direction (i.e., in an x direction) on the package substrate 100 such that the upper memory bonding pads 211, 221, and 231 formed in respective portions of the upper surfaces of the plurality of memory chips do not overlap each other in the vertical direction and are not covered by the adhesion member 223, 233, and 243. As the plurality of memory chips 210C, 220C, and 240C are positioned farther from the package substrate 100 in the vertical direction, the plurality of memory chips 210C, 220C. 230C, and 240C may be dispositioned farther from the processor chip 200 in the horizontal direction.

The plurality of first bonding wires 410 may electrically connect the plurality of memory chips 210C, 220C, 230C, and 240C to the signal transmission device 300C. The plurality of first bonding wires 410 may connect the plurality of upper memory bonding pads 211, 221, 231, and 241 of the plurality of memory chips 210C, 220C, 230C, and 240C to the upper pads 311 of the signal transmission device 300C, respectively. For convenience of explanation, the accompanying drawings illustrate some of the plurality of first bonding wires 410.

The second bonding wire 420 may directly connect the plurality of memory chips 210C, 220C, 230C, and 240C to the upper substrate pad 111 of the package substrate 100 without via the signal transmission device 300C. The second bonding wire 420 (instead of the first bonding wires 410) may connect a power/ground pad of the upper memory bonding pad 211, 221, 231, and 241 of the plurality of memory chips 210C, 220C, 230C, and 240C to a power/ground pad of the upper substrate pads 111 of the package substrate 100.

The second bonding wire 420 may be connected to a pad that provides a power/ground voltage to the plurality of memory chips 2100, 220C, 230C, and 240C, from among the upper memory bonding pads 211, 221, 231, and 241. According to some embodiments, the second bonding wire 420 may connect the memory chip 210C at the lowest position among the plurality of memory chips 210C, 220C, 230C, and 240C to the package substrate 100 and connect the plurality of memory chips 210C. 220C, 230C, and 240C to each other. Thus, the second bonding wire 420 may serially and sequentially connect the pad for the power/ground voltage of the package substrate 100 and the upper memory bonding pads 211, 221, 231, and 241 of the plurality of memory chips 210C, 220C, 230C, and 240C.

While input/output (I/O) signal transmission may be performed between the processor chip 200 and the plurality of memory chips 210C, 220C, 230C, and 240C via the signal transmission device 300C in a bilateral direction, a supply of the power/ground voltage may be performed between the plurality of memory chips 210C, 220C, 230C, and 240C and the package substrate 100 in a unilateral direction via the second bonding wire 420. In this case, the signal transmission device 300C may perform the I/O signal transmission between the processor chip 200 and the plurality of memory chips 210C, 220C, 230C, and 240C without supplying the power/ground voltage, and thus interference of the I/O signal transmission, which may be caused by, e.g., the power/ground voltage, may be reduced. Moreover, the plurality of memory chips 210C, 220C, 230C, and 240C may minimize power loss and may stably receive the power/ground voltage, as the plurality of memory chips 210C, 220C, 230C, and 240C may be powered and grounded to the outside via the external connection terminals 120 without passing through the signal transmission device 300C.

Figure 4A:
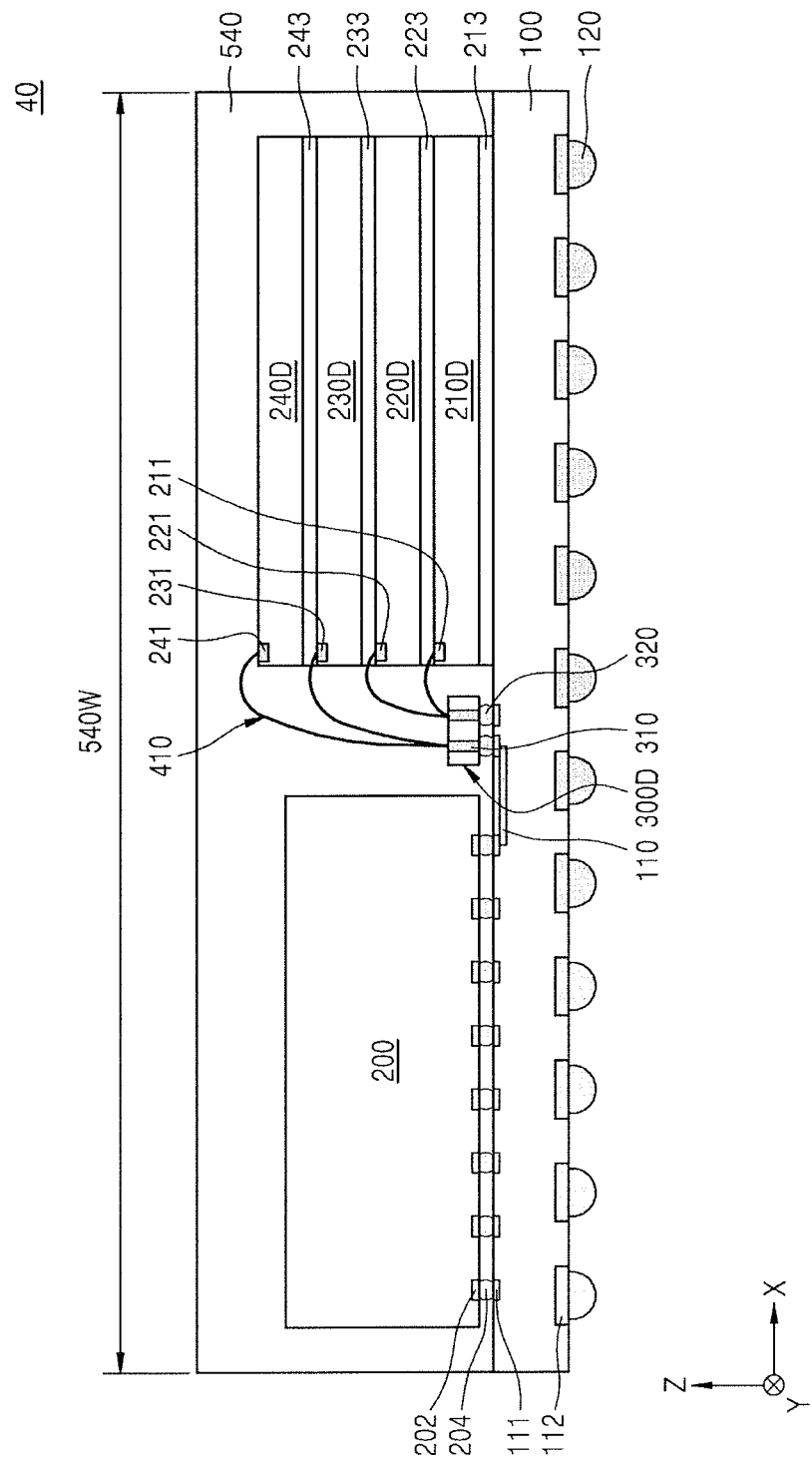
FIGS. 4A and 4B illustrate a semiconductor package according to an embodiment.
Figure 4B:
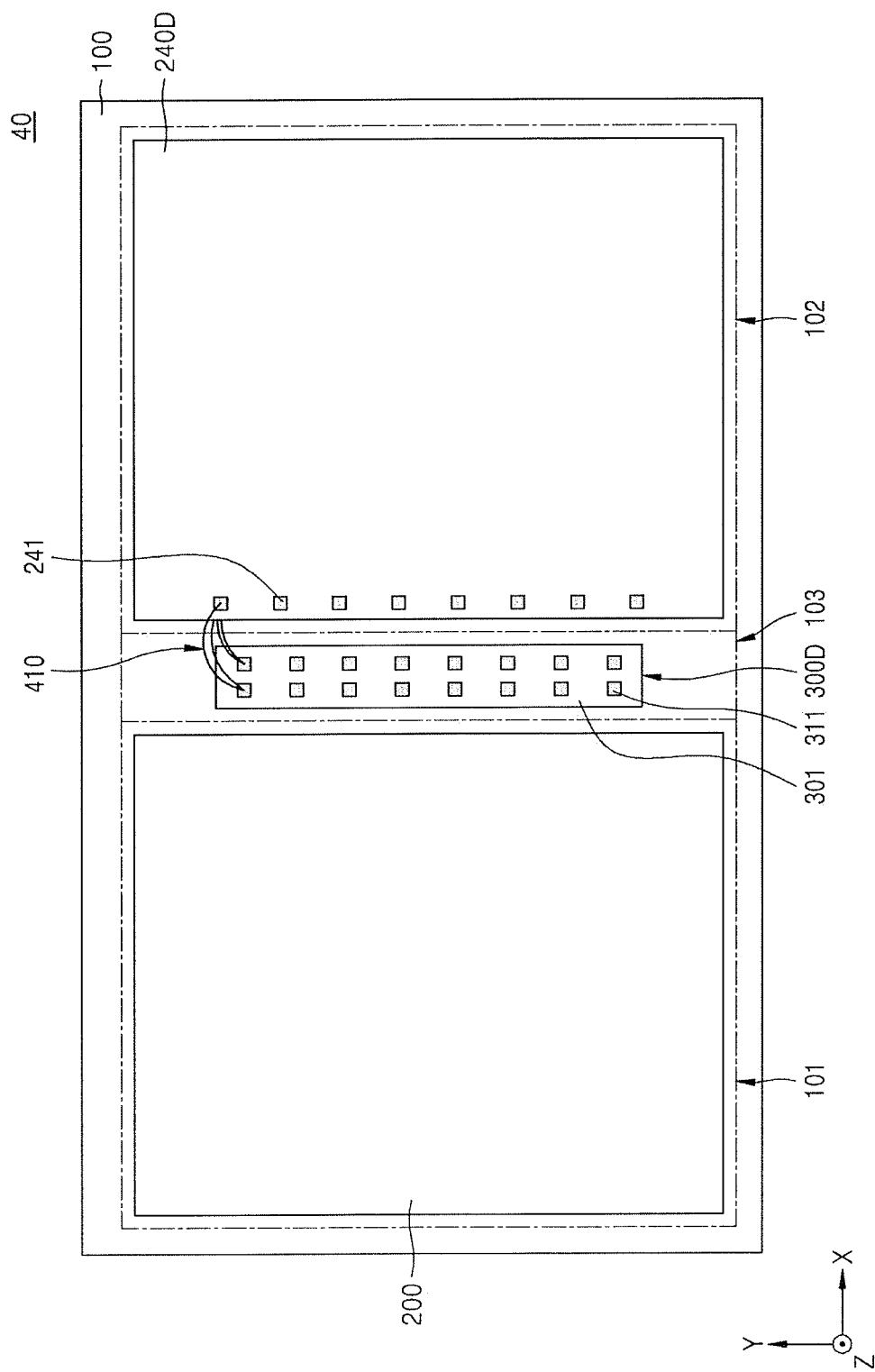

FIGS. 4A and 4B illustrate a semiconductor package 40 according to an embodiment.

FIG. 4A illustrates a vertical sectional view of the semiconductor package 40, and FIG. 4B illustrates a plan view of the semiconductor package 40. In FIG. 4B, a molding member 540 is not shown for clearly showing an internal structure of the semiconductor package 40.

Referring to FIGS. 4A and 4B, the semiconductor package 40 includes the package substrate 100, the processor chip 200, a plurality of memory chips 210D, 220D, 230D, and 240D that may exchange data with each other, a signal transmission device 300D, the plurality of first bonding wires 410, and the molding member 540.

Components that constitute the semiconductor package 40 and materials used to form the components are the same as or similar to those described above with reference to FIGS. 1A and 1B, and thus differences therebetween will be described.

At least two neighboring memory chips of the plurality of memory chips 210D, 220D, 230D, and 240D may be connected to one of the upper pads 311 of the signal transmission device 300D via corresponding first bonding wires 410 to which the at least two neighboring memory chips are connected. For example, corresponding first bonding wires 410 respectively connected to the memory chips 210D and 220D may be connected to a single first upper pad 311, and corresponding first bonding wires 410 respectively connected to the other memory chips 230D and 240D may be connected to a single second upper pad 311. According to other embodiments, all of the plurality of first bonding wires 410 connected to the plurality of memory chips 210D, 220D, 230D, and 240D may be connected to a single third upper pad 311. Thus, at least two of the plurality of memory chips 210D. 220D. 230D, and 240D may be the same kind of memory chips that may perform data combination or data merge between each other. Accordingly, compared with semiconductor packages in which a plurality of memory chips are different kinds of memory chips that may not perform data combination or data merge therebetween, the number of upper pads 311 may decrease, and a width of the signal transmission device 300D may be reduced.

The plurality of memory chips 210D, 220D, 230D, and 240D may be aligned with each other vertically, and at least one of the plurality of first bonding wires 410 may penetrate through at least one of the adhesion members 223, 233, and 243. Moreover, the width of the signal transmission device 300D may be reduced such that a horizontal distance between the processor chip 200 and the plurality of memory chips 210D, 220D, 230D, and 240D may decrease. In this case, compared with the semiconductor packages in which the plurality of memory chips are different kinds of memory chips, an area of the semiconductor package 40 may decrease, and accordingly, a width 540W of the molding member 540 may decrease.

Figure 5A:
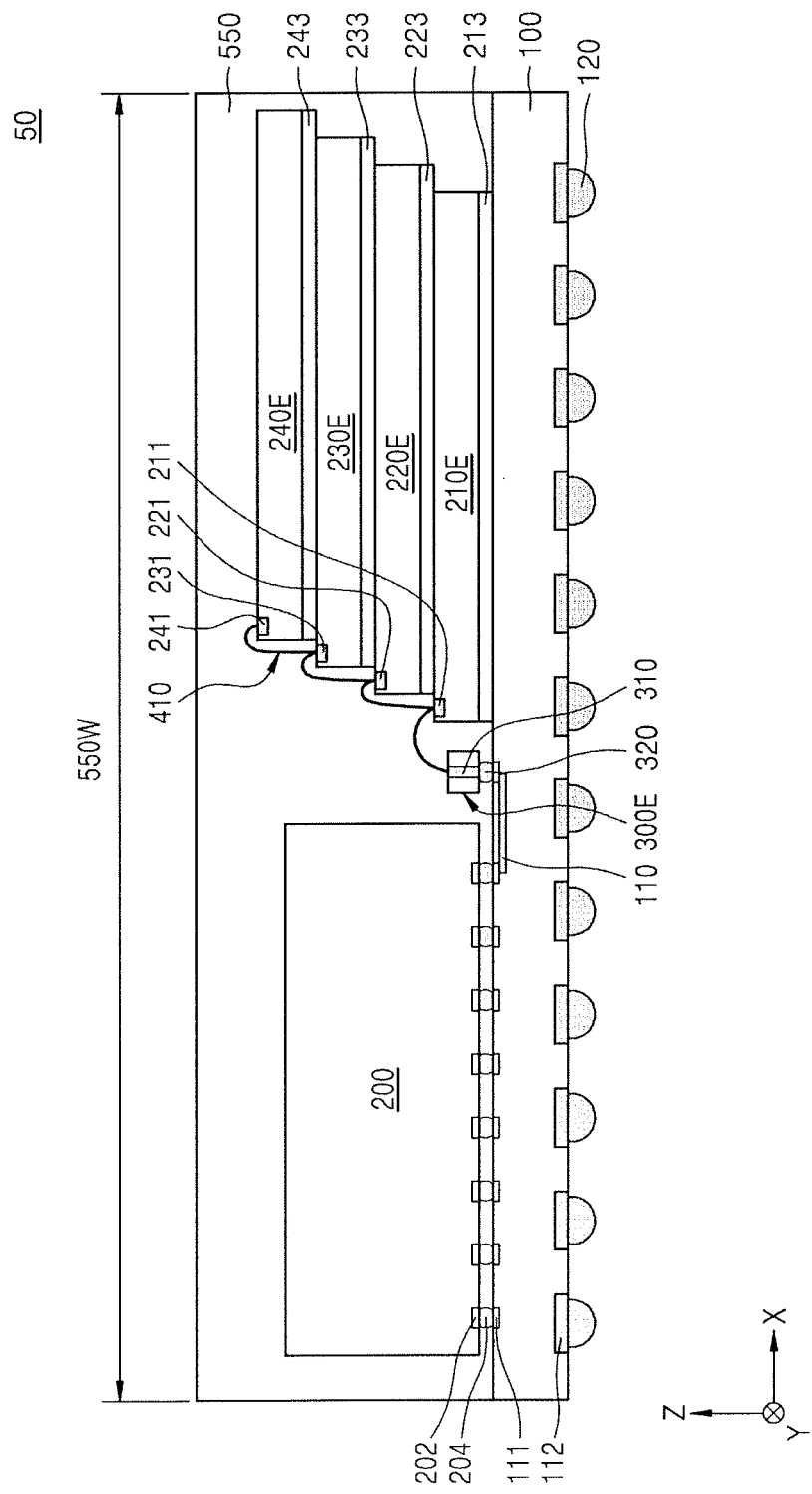
FIGS. 5A and 5B illustrate a semiconductor package according to an embodiment.
Figure 5B:
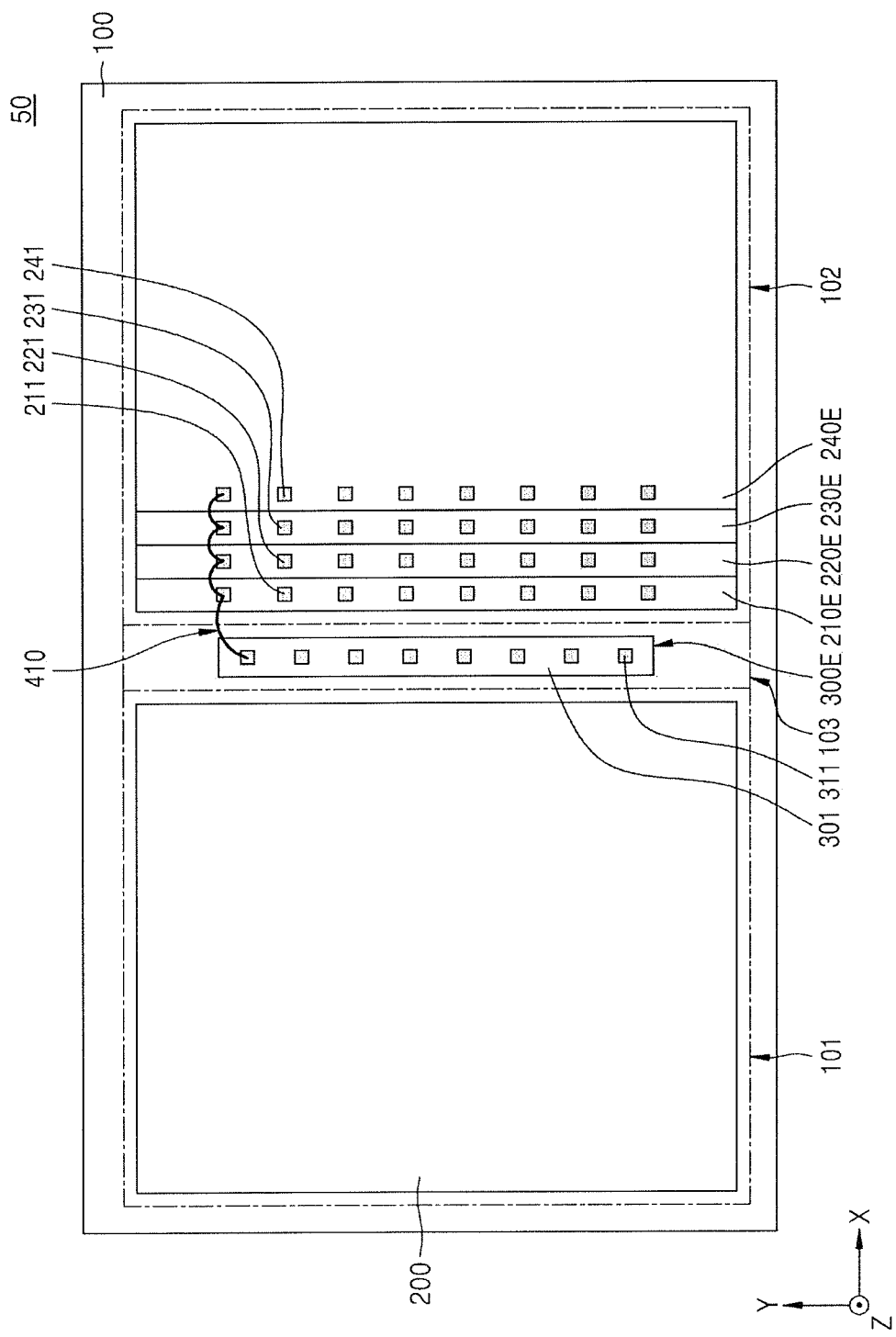

FIGS. 5A and 5B illustrate a semiconductor package 50 according to an embodiment.

FIG. 5A illustrates a vertical sectional view of the semiconductor package 50, and FIG. 5B illustrates a plan view of the semiconductor package 50. In FIG. 5B, a molding member 550 is not shown for clearly showing an internal structure.

Referring to FIGS. 5A and 5B, the semiconductor package 50 includes the package substrate 100, the processor chip 200, a plurality of memory chips 210E, 220E, 230E, and 240E that may exchange data with each other, a signal transmission device 300E, a plurality of first bonding wires 410 and the molding member 550.

Components that constitute the semiconductor package 50 and materials used to form the components are the same as or similar to those described above with reference to FIGS. 1A and 1B, and thus differences therebetween will be described.

The plurality of memory chips 210E, 220E, 230E, and 240E may be stacked on the second region 102 of the package substrate 100. The plurality of memory chips 210E, 220E, 230E, and 240E may be shifted by a certain distance from each memory chip in a horizontal direction on the package substrate 100 and may be sequentially stacked one on another such that the upper memory bonding pads 211, 221, and 231 formed in respective portions of the upper surfaces of the plurality of memory chips 210E, 220E, 230E, and 240E may not be covered by the adhesion member 223, 233, and 243. As the plurality of memory chips 210E, 220E, 230E, and 240E may be positioned farther from the package substrate 100, the plurality of memory chips 210E, 220E, 230E, and 240E may be stacked in a direction further away from the processor chip 200.

The plurality of memory chips 210E, 220E, 230E, and 240E may be connected to one of the upper pads 311 of the signal transmission device 300E via a plurality of first bonding wires 410 that may be connected to each other in series. For example, the plurality of first bonding wires 410 serially connected to the memory chips 210E, 220E, 230E, and 240E may be connected to a same first upper pad 311. The plurality of first bonding wires 410 may connect the plurality of memory chips 210E, 220E, 230E, and 240E to each other. Thus, all of the plurality of memory chips 210E, 220E, 230E, and 240E may be the same kind of memory chips that may perform data combination or data merge between each other. Accordingly, compared with semiconductor packages in which a plurality of memory chips are different kinds of memory chips, the number of upper pads 311 may decrease, and accordingly a width of the signal transmission device 300E may decrease.

In this case, compared with the semiconductor packages in which the plurality of memory chips are different kinds of memory chips, an area of the semiconductor package 50 may decrease, and accordingly, a width 550W of the molding member 550 may decrease.

Figure 6A:
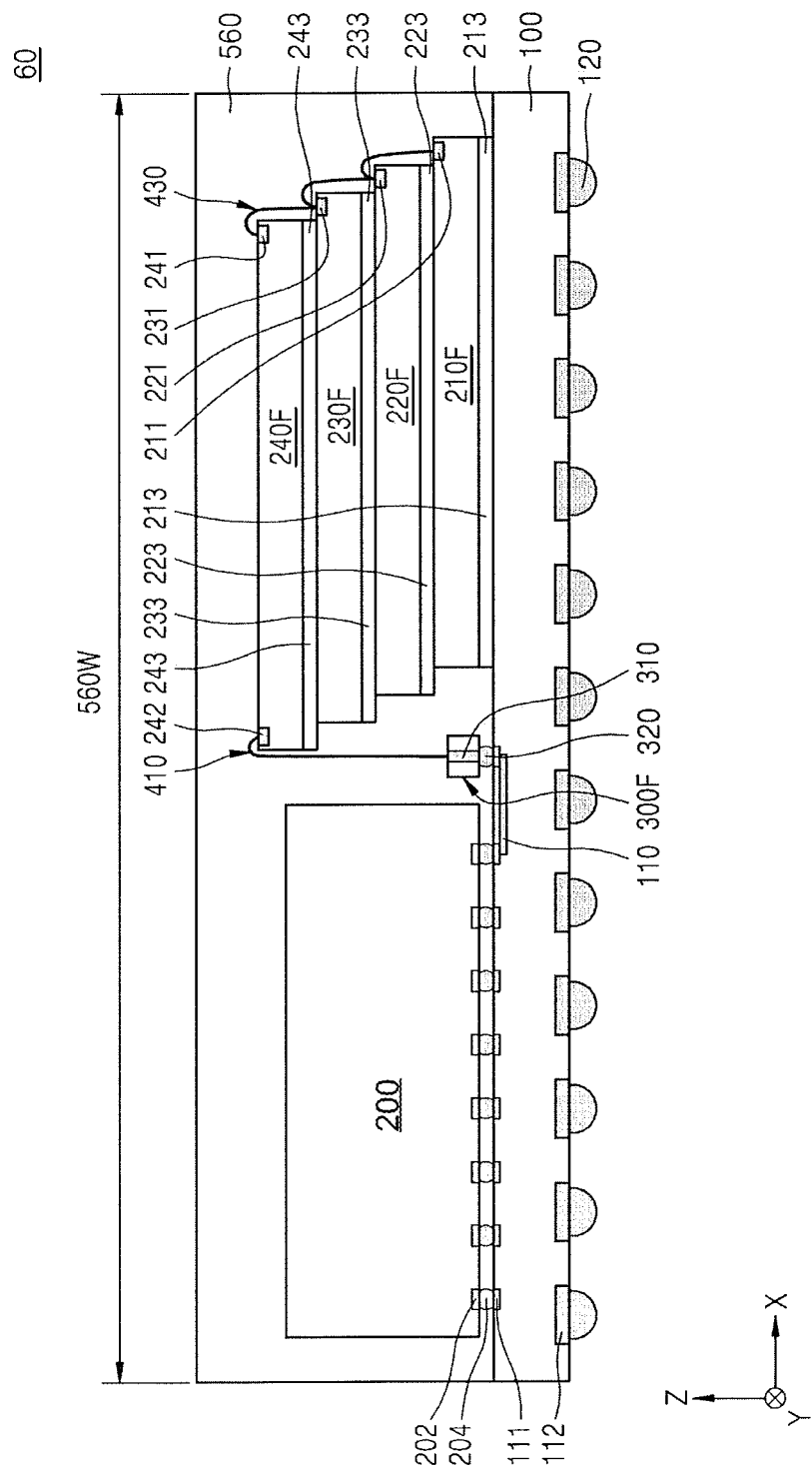
FIGS. 6A and 6B illustrate a semiconductor package according to an embodiment.
Figure 6B:
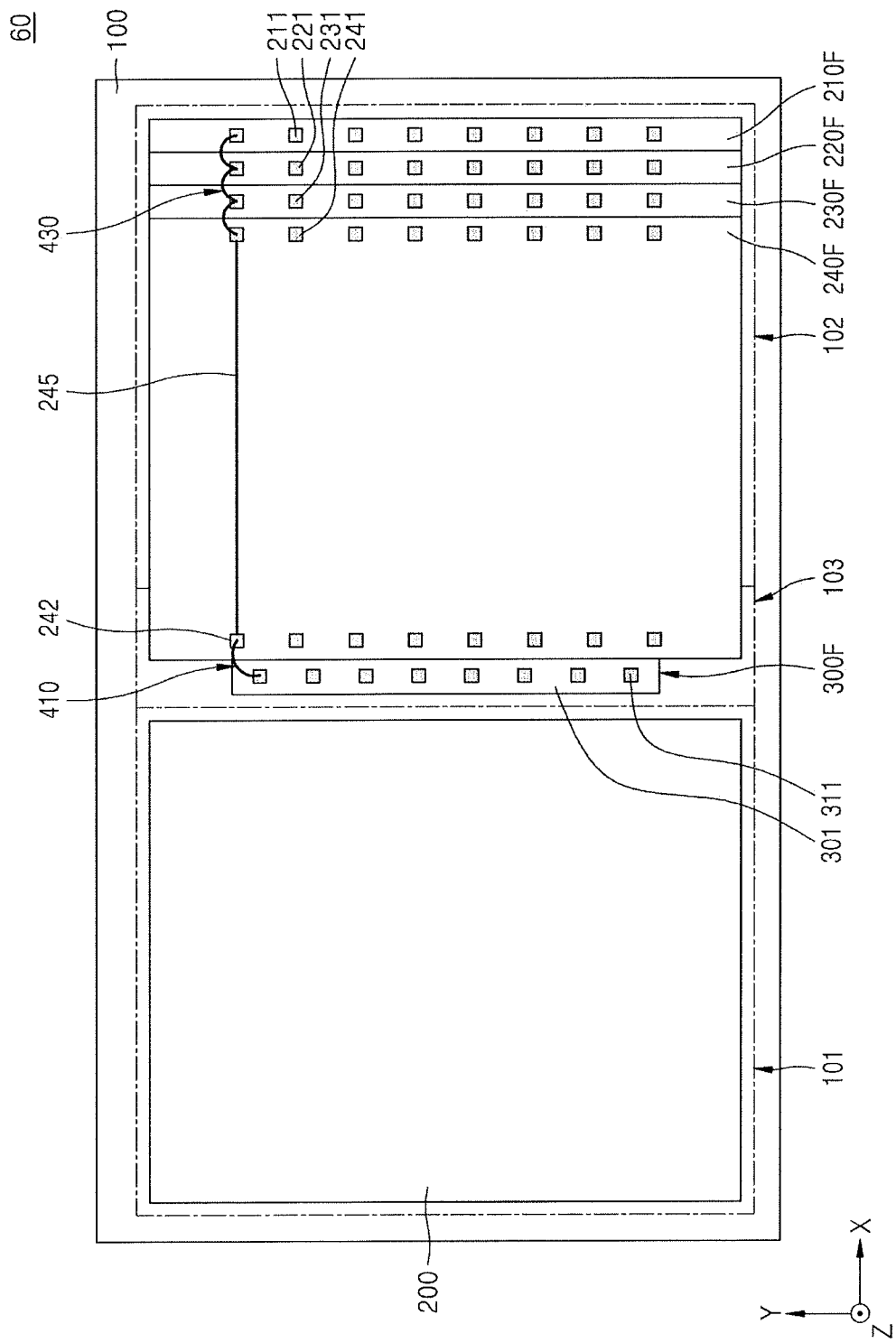

FIGS. 6A and 6B illustrate a semiconductor package 60 according to an embodiment.

FIG. 6A illustrates a vertical sectional view of the semiconductor package 60, and FIG. 6B illustrates a plan view of the semiconductor package 60. In FIG. 6B, a molding member 560 is not shown for clearly showing an internal structure.

Referring to FIGS. 6A and 6B, the semiconductor package 60 includes the package substrate 100, the processor chip 200, a plurality of memory chips 210F, 220F, 230F, and 240F that may exchange data with each other, a signal transmission device 300F, the plurality of first bonding wires 410, a third bonding wire 430, and the molding member 560.

Components that constitute the semiconductor package 60 and materials used to form the components are the same as or similar to those described above with reference to FIGS. 1A and 1B, and thus differences therebetween will be described below.

The plurality of memory chips 210F, 220F, 230F, and 240F may be stacked on the second region 102 of the package substrate 100. The plurality of memory chips 210F, 220F, 230F, and 240F may be shifted by a certain distance from each memory chip in a horizontal direction on the package substrate 100 and may be sequentially stacked one on another such that the upper memory bonding pads 211, 221, and 231 formed in respective portions of the upper surfaces of the plurality of memory chips 210F, 220F, 230F, and 240F may not be covered by the adhesion member 223, 233, and 243.

As the plurality of memory chips 210F, 220F, 230F, and 240F may be positioned farther from the package substrate 100, the plurality of memory chips 210F, 220F, 230F, and 240F may be stacked in a direction closer to the processor chip 200. Accordingly, in a plan view, at least a portion of the signal transmission device 300F may overlap the plurality of memory chips 210F, 220F, 230F, and 240F.

The plurality of memory chips 210F, 220F, 230F, and 240F may be connected to each other via the third bonding wire 430. The plurality of first bonding wires 410 may connect redistribution pads 242 formed on an upper surface of the memory chip 240F at the highest position among the plurality of memory chips 210F, 220F, 230F, and 240F to the upper pads 311 of the signal transmission device 300F. Thus, all of the plurality of memory chips 210F, 220F, 230F, and 240F may be the same kind of memory chips that may perform data combination or data merge between each other. Accordingly, compared with semiconductor packages in which a plurality of memory chips are different kinds of memory chips, the number of upper pads 311 may decrease, and accordingly a width of the signal transmission device 300F may decrease.

The memory chip 240F at the highest position among the plurality of memory chips 210F. 220F. 230F, and 240F may further include the redistribution pads 242 and redistribution lines 245. The redistribution line 245 may electrically connect the upper memory bonding pads 241 to the redistribution pads 242. The redistribution lines 245 may extend from the upper memory bonding pads 241 to the redistribution pads 242 such that the upper memory bonding pads 241 and the redistribution pads 242 may be flexibly located on the memory chip 240F. Thus, the redistribution pads 242 may be arranged adjacent to the signal transmission device 300F. The first bonding wires 410 may electrically connect the redistribution pads 242 to the upper pads 311. Accordingly, the redistribution pads 242 adjacent to the signal transmission device 300F may simplify an arrangement of the first bonding wires 410. For convenience of explanation, FIG. 6B illustrates that the redistribution lines 245 are exposed. However, the redistribution lines 245 may not be exposed.

The width of the signal transmission device 300F may decrease. As the signal transmission device 300F may be partially overlapped by the plurality of memory chips 210F, 220F, 230F, and 240F, an area independently occupied by the signal transmission device 300F may be reduced. In this case, compared with semiconductor packages in which a plurality of memory chips are different kinds of memory chips and semiconductor packages in which, when a plurality of memory chips are positioned farther from a package substrate, the plurality of memory chips are shifted by a certain distance from each memory chip in a direction further away from a processor chip and are stacked, an area of the semiconductor package 60 may decrease, and accordingly, a width 560W of the molding member 560 may decrease.

Figure 7:
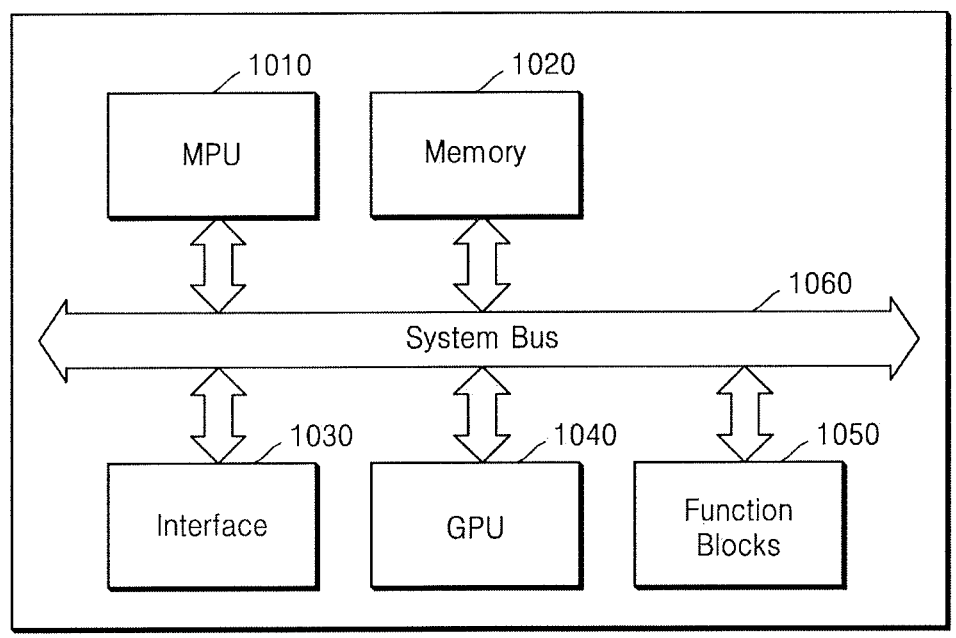
FIG. 7 is a block diagram illustrating a structure of a semiconductor package according to an embodiment.

FIG. 7 illustrates a block diagram of a structure of a semiconductor package 1000 according to an embodiment.

Referring to FIG. 7, the semiconductor package 1000 may include a microprocessor unit (MPU) 1010, a memory 1020, an interface 1030, a graphics processing unit (GPU) 1040, function blocks 1050, and a system bus 1060 via which these components may be connected to one another. The semiconductor package 1000 may include both the MPU 1010 and the GPU 1040 or may include either the MPU 1010 or the GPU 1040.

The MPU 1010 may include a core and an L2 cache. For example, the MPU 1010 may include multiple cores. The multiple cores may preform identical functions or different functions. The multiple cores may be activated at the same time or at different time points.

The memory 1020 may store results of processes performed in the function blocks 1050, under the control of the MPU 1010. The interface 1030 may transmit or received information or signals with external devices. The GPU 1040 may perform graphic functions. For example, the GPU 1040 may perform a video codec or a 3D graphic process. The function blocks 1050 may perform various functions. For example, the semiconductor package 1000 may be an application processor (AP) for use in mobile devices, some of the function blocks 1050 may perform a communication function. The semiconductor package 1000 may include one of the semiconductor packages 10, 20, 30, 40, 50, and 60 according to embodiments described above with reference to FIGS. 1A-6B.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a package substrate;
    a processor chip mounted on a first region of the package substrate;
    a plurality of memory chips mounted on a second region of the package substrate, the second region of the package substrate being spaced apart from the first region of the package substrate;
    a signal transmission device mounted on a third region of the package substrate between the first and second regions of the package substrate, the processor chip and the signal transmission device transmit a signal therebetween via the package substrate; and
    a plurality of first bonding wires that connect the plurality of memory chips directly to the signal transmission device, the plurality of memory chips and the signal transmission device transmit a signal therebetween via the plurality of first bonding wires without passing via the package substrate,
    wherein the signal transmission device includes:
        upper pads in an upper surface portion of the signal transmission device, the upper pads connected to the plurality of first bonding wires;
        penetrating electrodes in a main body portion of the signal transmission device, the penetrating electrodes connected to the upper pads; and
        lower pads in a lower surface portion of the signal transmission device, the lower pads connected to the penetrating electrodes and connected to the package substrate via bonding balls.

2. The semiconductor package as claimed in claim 1, further comprising:
    a second bonding wire that directly connects the plurality of memory chips to the package substrate.

3. The semiconductor package as claimed in claim 2, wherein:
    the plurality of memory chips include an input/output (I/O) pad and a power/ground pad,
    the plurality of first bonding wires are connected to the I/O pad, and
    the second bonding wire is connected to the power/ground pad.

4. The semiconductor package as claimed in claim 2, wherein the second bonding wire connects a memory chip at a lowest position among the plurality of memory chips to the package substrate and connects the plurality of memory chips to one another.

5. The semiconductor package as claimed in claim 1, wherein
    each of the plurality of memory chips includes:
        a semiconductor substrate having an active surface and an inactive surface that face each other;
        a memory device on the active surface; and
        an upper memory bonding pad on the active surface, the upper memory bonding pad connected to the first bonding wires, and wherein
    the plurality of memory chips are sequentially and horizontally shifted by a distance from each other and stacked such that the upper memory bonding pads are exposed.

6. The semiconductor package as claimed in claim 5, wherein the memory chips are positioned horizontally farther from the processor chip as the memory chips are positioned vertically farther from the package substrate.

7. The semiconductor package as claimed in claim 5, wherein the memory chips are positioned horizontally closer to the processor chip as the memory chips are positioned vertically farther from the package substrate.

8. The semiconductor package as claimed in claim 7, wherein in a plan view, a plane area of the signal transmission device is less than a plane area of at least one of the plurality of memory chips, and a portion of the signal transmission device overlaps the at least one of the plurality of memory chips.

9. The semiconductor package as claimed in claim 1, wherein the signal transmission device further includes a buffer circuit to control a capacitance loading of the plurality of memory chips.

10. A semiconductor package, comprising:
a package substrate;
a processor chip mounted on the package substrate;
a plurality of memory chips mounted on the package substrate and to exchange data with each other;
a signal transmission device mounted on the package substrate, the processor chip and the signal transmission device transmit a signal therebetween via the package substrate;
a plurality of first bonding wires that connect the plurality of memory chips directly to the signal transmission device, the plurality of memory chips and the signal transmission device transmit a signal therebetween via the plurality of first bonding wires without passing via the package substrate; and
a molding member that covers lateral surfaces of the processor chip, the plurality of memory chips, and the signal transmission device, wherein:
the processor chip, the plurality of memory chips, and the signal transmission device are spaced apart from each other, and
the signal transmission device includes:
 upper pads in an upper surface portion of the signal transmission device, the upper pads connected to the plurality of first bonding wires;
 penetrating electrodes in a main body portion of the signal transmission device, the penetrating electrodes connected to the upper pads; and
 lower pads in a lower surface portion of the signal transmission device, the lower pads connected to the penetrating electrodes and connected to the package substrate via bonding balls.

11. The semiconductor package as claimed in claim 10, wherein:
the plurality of memory chips are identical, and
at least two of the plurality of first bonding wires are connected to a single upper pad of the signal transmission device.

12. The semiconductor package as claimed in claim 10, wherein:
the plurality of memory chips include upper memory bonding pads connected to the first bonding wires, and are sequentially and horizontally shifted by a distance from each other and stacked such that the upper memory bonding pads are exposed, and
the plurality of first bonding wires connect the upper memory bonding pad of a memory chip at a lowest position among the plurality of memory chips to the upper pads of the signal transmission device and connect the upper memory bonding pads of the plurality of memory chips to each other.

13. The semiconductor package as claimed in claim 10, wherein:
the plurality of memory chips include upper memory bonding pads, and are sequentially and horizontally shifted by a distance from each other and stacked such that the upper memory bonding pads are exposed,
a memory chip at a highest position among the plurality of memory chips further includes redistribution pads connected to the first bonding wires,
the semiconductor package further includes a third bonding wire that connects the upper memory bonding pads to each other.

14. The semiconductor package as claimed in claim 13, wherein the memory chip at the highest position further includes redistribution lines that electrically connect the upper memory bonding pads to the redistribution pads.

* * * * *